(12) United States Patent
Zhang et al.

(10) Patent No.: US 9,160,949 B2
(45) Date of Patent: Oct. 13, 2015

(54) ENHANCED PHOTON DETECTION DEVICE WITH BIASED DEEP TRENCH ISOLATION

(71) Applicant: OMNIVISION TECHNOLOGIES, INC., Santa Clara, CA (US)

(72) Inventors: Bowei Zhang, Fremont, CA (US); Zhiqiang Lin, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 365 days.

(21) Appl. No.: 13/854,446

(22) Filed: Apr. 1, 2013

(65) Prior Publication Data

US 2014/0291481 A1    Oct. 2, 2014

(51) Int. Cl.
*H04N 5/361* (2011.01)
*H01L 31/02* (2006.01)
*H01L 27/146* (2006.01)

(52) U.S. Cl.
CPC ............ *H04N 5/361* (2013.01); *H01L 27/1463* (2013.01); *H01L 27/14643* (2013.01); *H01L 31/02* (2013.01)

(58) Field of Classification Search
CPC ......... H01L 31/18; H01L 27/146; H04N 5/76
USPC ....................................... 250/208.1; 257/443
See application file for complete search history.

(56) References Cited

U.S. PATENT DOCUMENTS

| | | | |
|---|---|---|---|
| 7,838,956 B2 | 11/2010 | McCarten et al. | |
| 8,188,563 B2 | 5/2012 | Finkelstein et al. | |
| 8,445,992 B2 * | 5/2013 | Hsin et al. | 257/603 |
| 8,723,100 B2 * | 5/2014 | Sanfilippo et al. | 250/214.1 |
| 8,994,138 B2 * | 3/2015 | Roy et al. | 257/443 |
| 2005/0184353 A1 | 8/2005 | Mouli | |
| 2008/0265348 A1 | 10/2008 | Maas et al. | |
| 2009/0184384 A1 | 7/2009 | Sanfilippo et al. | |

(Continued)

FOREIGN PATENT DOCUMENTS

| | | |
|---|---|---|
| JP | H 05-211321 A | 8/1993 |
| JP | 2005-101864 A | 4/2005 |

(Continued)

OTHER PUBLICATIONS

Karami, M. A., "Deep-submicron CMOS Single Photon Detectors and Quantum Effects," Technische Universiteit Delft, Netherlands, 2011 (121 pages).

(Continued)

*Primary Examiner* — Seung C Sohn
(74) *Attorney, Agent, or Firm* — Blakely Sokoloff Taylor & Zafman LLP

(57) ABSTRACT

A photon detection device includes a photodiode having a planar junction disposed in a first region of semiconductor material. A deep trench isolation (DTI) structure is disposed in the semiconductor material. The DTI structure isolates the first region of the semiconductor material on one side of the DTI structure from a second region of the semiconductor material on an other side of the DTI structure. The DTI structure includes a dielectric layer lining an inside surface of the DTI structure and doped semiconductor material disposed over the dielectric layer inside the DTI structure. The doped semiconductor material disposed inside the DTI structure is coupled to a bias voltage to isolate the photodiode in the first region of the semiconductor material from the second region of the semiconductor material.

25 Claims, 3 Drawing Sheets

(56) References Cited

U.S. PATENT DOCUMENTS

| | | |
|---|---|---|
| 2010/0148040 A1 | 6/2010 | Sanfilippo et al. |
| 2010/0163925 A1 | 7/2010 | Ishibashi et al. |
| 2011/0272561 A1 | 11/2011 | Sanfilippo et al. |
| 2012/0153423 A1 | 6/2012 | Lee |
| 2012/0261730 A1 | 10/2012 | Chen et al. |

FOREIGN PATENT DOCUMENTS

| | | |
|---|---|---|
| JP | 2007-005697 | 1/2007 |
| TW | 200519697 A | 3/2007 |
| WO | WO 2012/032353 A2 | 3/2012 |

OTHER PUBLICATIONS

EP 14162895.8—Extended European Search Report, issued Jun. 23, 2014 (6 pages).

JP Patent Application No. 2014-071001—Japanese Office Action and Search Report, with English Translation, issued Apr. 13, 2015 (6 pages).

TW Patent Application No. 102139380—Taiwanese Office Action and Search Report, with English Translation, issued Apr. 10, 2015 (29 pages).

KR Patent Application No. 2014-0037936—Korean Office Action, with English Translation, issued Apr. 29, 2015 (15 pages).

\* cited by examiner

ENHANCED PHOTON DETECTION DEVICE WITH BIASED DEEP TRENCH ISOLATION

BACKGROUND INFORMATION

1. Field of the Disclosure

The present invention is generally related to photodiodes, and more specifically, the present invention is directed to photodiodes utilized in photon sensors.

2. Background

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

There is a continuing demand to reduce the size of image sensors, which results in the smaller pixel cells for an image sensor with the same resolution. One type of photodetector that may be used in an image sensor or in a light detector is a single photon avalanche diode (SPAD). A SPAD normally needs a guard ring or isolation to overcome the problem of premature edge breakdown and interference between adjacent pixels. Known designs to create the guard ring or isolation increase the area of each pixel cell and sacrifices fill factor. Furthermore, as image sensors are miniaturized, the pixel cells contained therein suffer from increased dark current rates.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
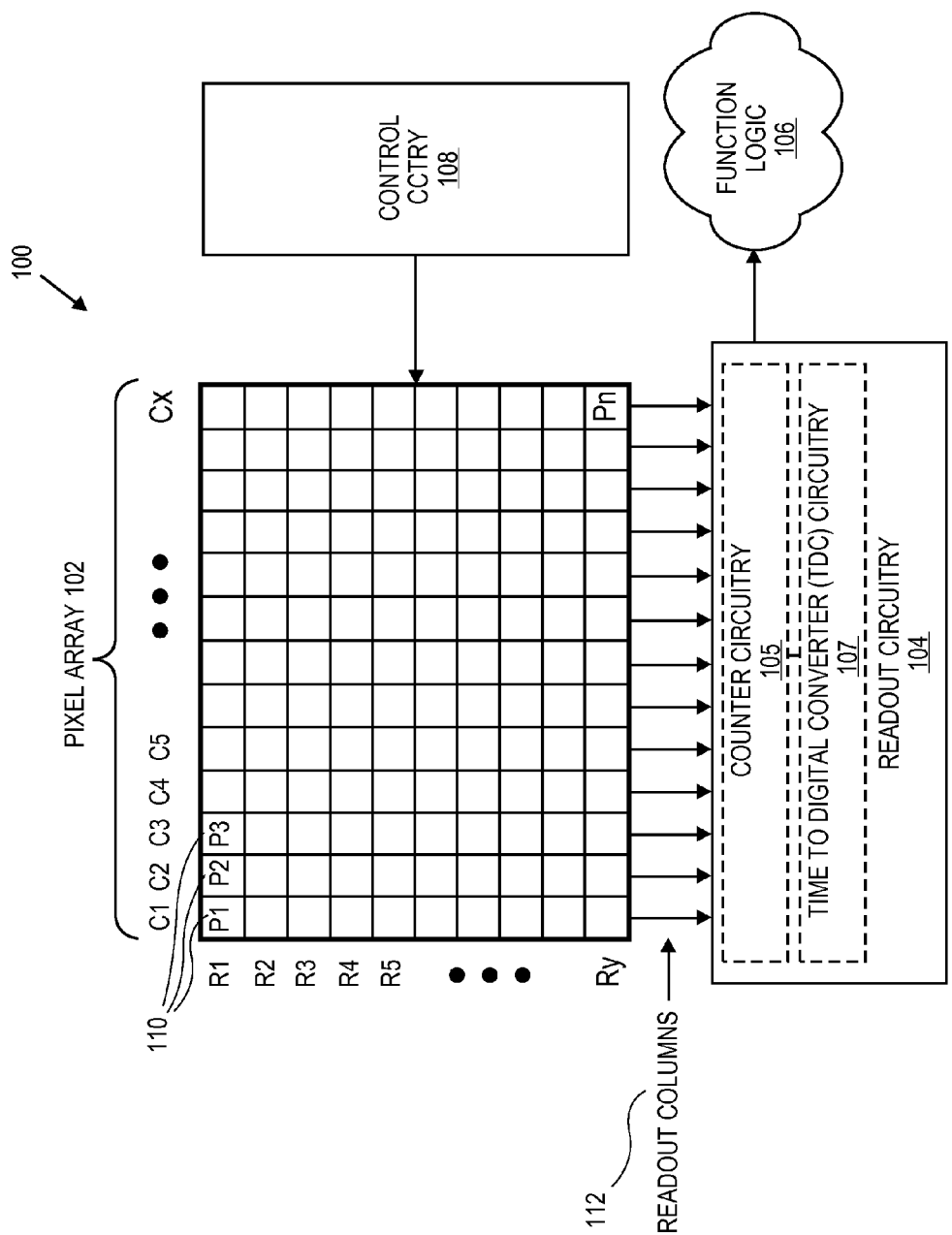
FIG. 1 is a diagram illustrating one example of an photon sensing system with an example photon sensor including enhanced photon detection devices with biased deep trench isolation in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe a photon sensor including enhanced photon detection devices with biased deep trench isolation in accordance with the teachings of the present invention. In one example, the biased deep trench isolation structures are capacitive type isolation structures. As will be shown, in various examples, photon detection devices in accordance with the teachings of the present invention utilize a P enhanced single photon avalanche diode (SPAD) structure with no guard ring required. In addition, in various examples, a biased deep trench isolation (DTI) structure is included to provide isolation using much less area when compared with known isolation techniques, which allows pixels to be placed much closer together in a photon sensor in accordance with the teachings of the present invention. In one example, the DTI is formed with polysilicon and may be biased to reduce dark current in a photo collection area the SPAD in accordance with the teachings of the present invention. Furthermore, the utilization of a biased DTI in accordance with the teachings of the present invention allows a SPAD to be separated from its quenching circuit and allows the wells of the SPAD and the quenching circuit to be biased at different voltages.

To illustrate, FIG. 1 is a diagram that shows generally one example of a photon sensing system 100 including an example pixel array 102 having pixel cells 110 that include enhanced photon detection devices with biased deep trench isolation in accordance with the teachings of the present invention. In one example, the photon detection devices in pixel cells 110 are back side illuminated. In another example, the photon detection devices in pixel cells 110 are front side illuminated. As shown in the depicted example, pixel array 102 is a two-dimensional (2D) array of photon detectors or pixel cells 110 (e.g., pixels P1, P2 . . . , Pn). As illustrated, each pixel 110 is arranged into a row (e.g., rows R1 to Ry) and a column (e.g., column C1 to Cx) to acquire photon data. In another example, it is appreciated that pixel array 102 may be a one-dimensional (1D) array including one row of photon detectors or pixel cells 110 in accordance with the teachings of the present invention.

In one example, each pixel 110 converts a photon event into a digital signal pulse. In various examples, photon data from each pixel 110 may be read out by readout circuitry 104 through readout columns 112 as shown. In various examples, readout circuitry 104 includes counter circuitry 105 coupled to receive photon data to count the photon events, which are indicated in the digital signal pulses received from each pixel 110. In various examples, readout circuitry 104 may also include, time to digital converter (TDC) circuitry 107 coupled to counter circuitry 105 to record photon timing information associated with the photon events in the photon data received from each pixel 110. In one example, the photon data, which in one example includes the count and timing information, is then transferred to function logic 106. Function logic 106 may simply store the photon data or may even manipulate the photon data by performing post processing and/or analysis. In one example, readout circuitry 104 may read out a row of photon data at a time along readout column lines (illustrated) or may read out the photon data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling photon data acquisition. In one example, the shutter signal is a global shutter signal for simultaneously enabling all pixels within pixel array 102 to simultaneously capture their respective photon data during a single acquisition window.

Figure 2:
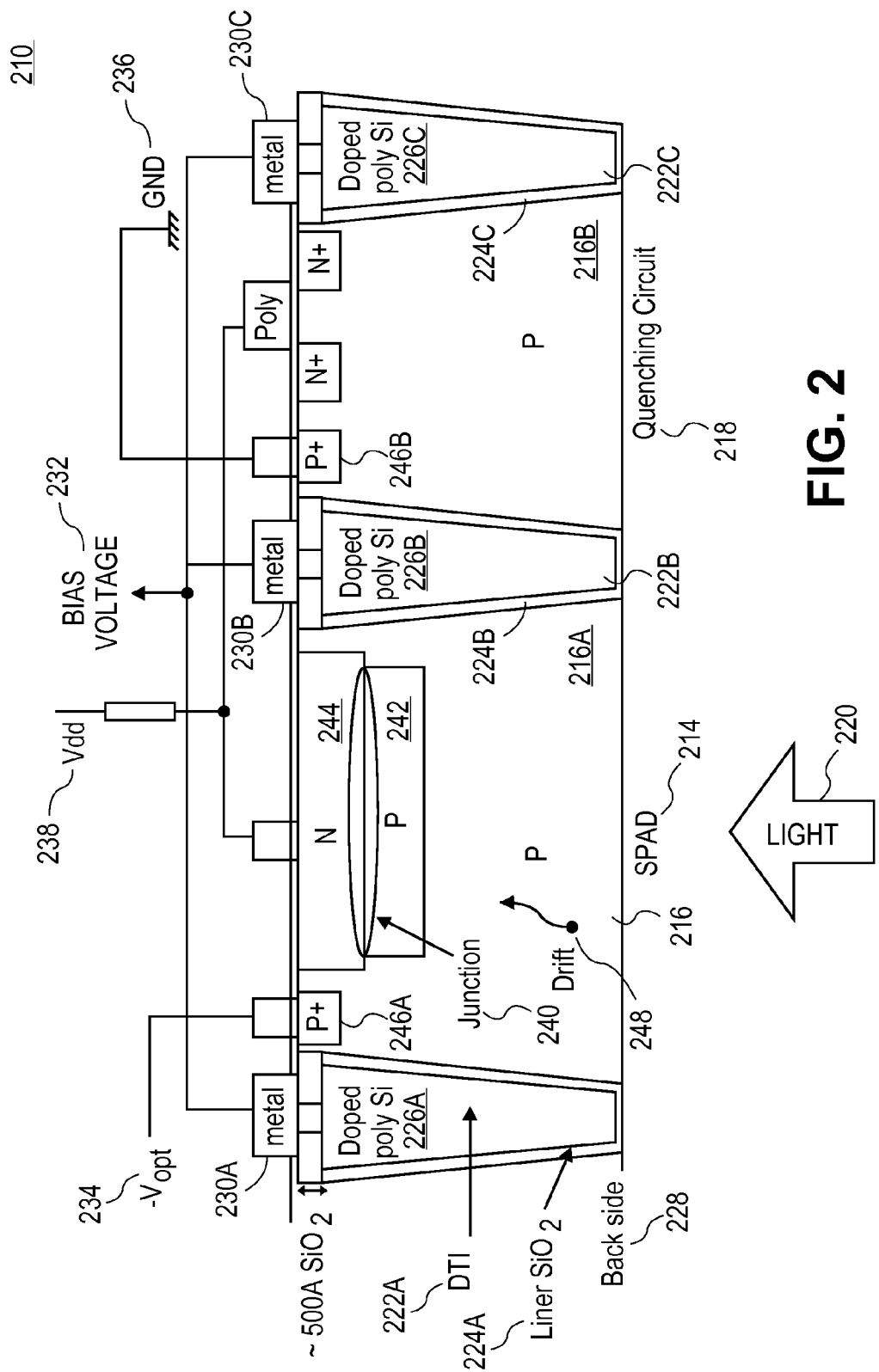
FIG. 2 is a cross-section view illustrating one example of an enhanced photon detection device with biased deep trench isolation in accordance with the teachings of the present invention.

FIG. 2 is a cross-section view illustrating one example of an enhanced photon detection device 210 with biased deep trench isolation structures in accordance with the teachings of the present invention. In one example, the photon detection device 210 of FIG. 2 may be utilized in pixel cells 110 of pixel array 102 of FIG. 1. As shown in the example of FIG. 2, photon detection device 210 includes a photodiode 214 having a planar junction 240 disposed in a first region 216A of semiconductor material 216. In the depicted example, photodiode 214 is a single photon avalanche diode (SPAD) having a breakdown junction defined at a planar junction 240 between P doped region 242 and N doped region 244 of photodiode 214 in the P type semiconductor material 216 as shown. In one example, P doped region 242 may be considered a P enhanced doping region in accordance with the teachings of the present invention.

As shown in the illustrated example, photon detection device 210 also includes one or more deep trench isolation (DTI) structures 222A, 222B and 222C disposed in the semiconductor material 216. As shown FIG. 2, each DTI structure 222A, 222B and 222C is lined with a thin dielectric layer. In one example, the thin dielectric layers include silicon dioxide (SiO$_2$), or another suitable insulating material. In particular, example FIG. 2 shows that DTI structure 222A includes a thin dielectric layer 224A lining an inside surface of the DTI structure 222A, DTI structure 222B includes a thin dielectric layer 224B lining an inside surface of the DTI structure 222B, and DTI structure 222C includes a thin dielectric layer 224C lining an inside surface of the DTI structure 222C.

In addition, each DTI structure 222A, 222B and 222C is filled with lightly doped semiconductor material. For instance, example FIG. 2 shows that DTI structure 222A is filled with doped polysilicon 226A over dielectric layer 224A, DTI structure 222B is filled with doped polysilicon 226B over dielectric layer 224B, and DTI structure 222C is filled with doped polysilicon 226C over dielectric layer 224C.

The example depicted in FIG. 2 also shows that each DTI structure 226A, 226B and 226C is biased with a bias voltage 232. In particular, example FIG. 2 shows that DTI structure 222A is coupled to bias voltage 232 through metal 230A, DTI structure 222B is coupled to bias voltage 232 through metal 230B, and DTI structure 222C is coupled to bias voltage 232 through metal 230C. It is noted that with each DTI structure 222A, 222B and 222C being filled with doped semiconductor material that separated from the semiconductor material with a thin dielectric layer as described, capacitive type isolation structures are provided.

In operation, it is appreciated that the biased DTI structures 222A, 222B and 222C provide isolation between the regions of the semiconductor material 216 on opposite sides of the respective biased DTI structure. To illustrate, biased DTI structure 222B isolates the first region 216A of semiconductor material 216, which is located on the left hand side of biased DTI structure 222B in FIG. 2, from the second region 216B of semiconductor material 216, which is located on the right hand side of biased DTI structure 222B in FIG. 2 in accordance with the teachings of the present invention. It is appreciated that the biased DTI structures 222A, 222B and 222C require much less area than other known doping well isolation solutions. Therefore, a plurality of photodiodes 214 can be placed much closer to each other in semiconductor material 216 with biased DTI structures 222A, 222B and 222C in accordance with the teachings of the present invention. In one example, the biased DTI structures 222A, 222B and 222C are biased to control or reduce dark current in the photo collection area of photodiode 214 in accordance with the teachings of the present invention. In one example, it is noted that the semiconductor material just opposite the biased DTI structure may be further doped to further reduce dark current in accordance with the teachings of the present invention.

As shown in the depicted example, photodiode 214 is adapted to be illuminated with light 220 that is directed through the back side 228 of semiconductor material 216. In another example (not shown), it is appreciated that photodiode 214 may be adapted to be illuminated with light 220 that is directed through the front side of semiconductor material 216. In the example depicted in FIG. 2, a P enhanced SPAD photodiode 214 is provided, which has a relatively large P doping area through which light 220 is directed from back side 228. The breakdown junction of the P enhanced SPAD photodiode 214 is defined at the planar PN junction 240 between P doped region 242 and N doped region 244. In one example, the doping density in the N doped silicon region 244 gradually decreases towards an edge of the N doped silicon region 244, which helps to reduce breakdown from occurring at the edges of the planar PN junction 240. In operation, the planar PN junction 240 is reversed bias. In the illustrated example, the first region 216A of semiconductor material 216 is coupled to be biased at a bias voltage −Vopt 234 through P+ biasing node 246A and N doped region 244 is coupled to be biased at a voltage Vdd 238. Accordingly, the reverse bias on the SPAD is Vdd+Vopt in the illustrated example. Thus, electrons 248 that are photogenerated with light 220 entering through the back side 228 of semiconductor material 216 can drift through the relatively large P doping area of the first region 216A as shown to the reverse biased planar PN junction 240 to trigger breakdown in the P enhanced SPAD photodiode 214 in accordance with the teachings of the present invention.

In the example depicted in FIG. 2, a quenching circuit 218 is disposed the second region 216B of the semiconductor material 216, which is isolated from first region 216A of the semiconductor material 216 with biased DTI structure 226B as discussed. Quenching circuit 218 is coupled to the P enhanced SPAD photodiode 214 to limit an avalanche current in the P enhanced SPAD photodiode 214. However, with the isolation provided with biased DTI structure 226B, high field regions of the P enhanced SPAD photodiode 214 are isolated from the quenching circuit 218 in accordance with the teachings of the present invention.

It is appreciated that another feature of the enhanced photon detection device 210 shown in FIG. 2 is that the utilization of biased DTI structure 226B to isolate the P enhanced SPAD photodiode 214 from quenching circuit 218 is that the P doped regions 216A and 216B of semiconductor material 216 may be biased at different voltages. To illustrate, as shown in the example depicted in FIG. 2, the first region 216A of semiconductor material 216, in which P enhanced SPAD photodiode 214 is disposed, is coupled to a negative voltage −Vopt 234 through P+ biasing node 246A. The second region 216B of semiconductor material 216, in which quenching circuit 218 is disposed, is coupled to ground GND through P+ biasing node 246B and the N doped region 244 of P enhanced SPAD photodiode 214 is coupled to be biased at a voltage Vdd 238 as shown. Thus, the reverse bias on the P enhanced SPAD photodiode 214 is Vdd+Vopt and the output signal of P enhanced SPAD photodiode 214 is compatible with the operation voltage of quenching circuit 218 in accordance with the teachings of the present invention.

Figure 3:
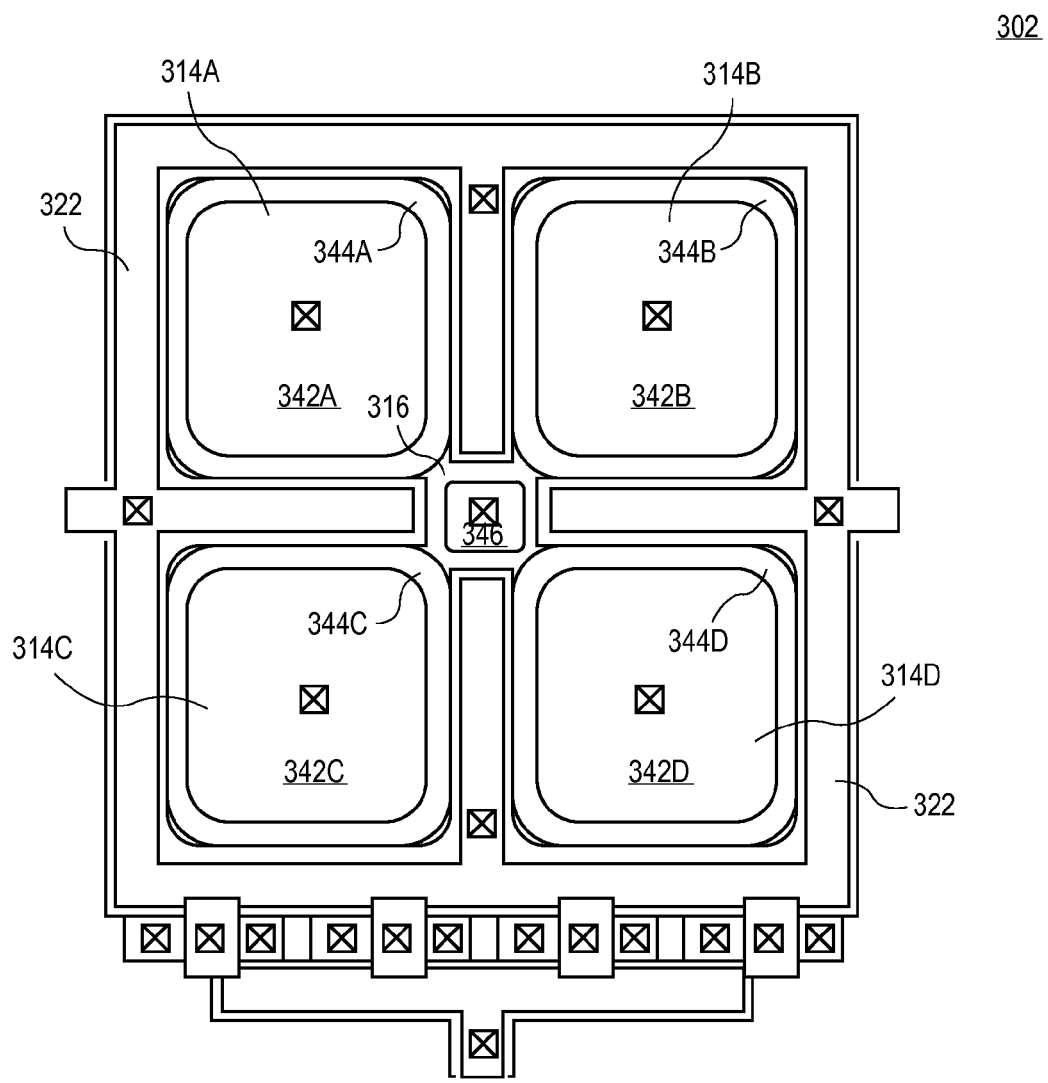
FIG. 3 illustrates a top down view of a portion of one example of a photon sensor 302 including enhanced photon detection devices with biased deep trench isolation in accordance with the teachings of the present invention.

FIG. 3 illustrates a bottom up view showing a back side portion of one example of an example photon sensor 302 including enhanced photon detection devices with biased deep trench isolation in accordance with the teachings of the present invention. As shown in the depicted example, photon sensor 302 includes a plurality of photodiodes 314A, 314B, 314C and 314D disposed in semiconductor material 316. In one example, each one of the plurality of photodiodes 314A, 314B, 314C and 314D illustrated in FIG. 3 is substantially similar to the P enhanced SPAD photodiode 214 described above in FIG. 2. Thus, photodiode 314A includes a planar junction defined between P doped semiconductor material 342A and N doped semiconductor material 344A, photodiode 314B includes a planar junction defined between P doped semiconductor material 342B and N doped semiconductor material 344B, photodiode 314C includes a planar junction defined between P doped semiconductor material 342C and N doped semiconductor material 344C, and photodiode 314D includes a planar junction defined between P doped semiconductor material 342D and N doped semiconductor material 344D.

As shown in the depicted example, photon sensor 302 also includes a biased DTI structure 322, which is substantially similar to biased DTI structures 222A, 222B and 222C of FIG. 2. In the example depicted in FIG. 3, biased DTI structure 322 is arranged and biased in semiconductor material 316 as shown to isolate the high field regions of each P enhanced SPAD photodiode 314A, 314B, 314C and 314D in accordance with the teachings of the present invention. In particular, biased DTI structure 322 is arranged in the semiconductor material 316 such that each one of the P enhanced SPAD photodiodes 314A, 314B, 314C and 314D is separated from a neighboring one of the P enhanced SPAD photodiodes 314A, 314B, 314C and 314D and corresponding support circuit elements with biased DTI structure 322 in accordance with the teachings of the present invention.

Another feature included in photon sensor 302 as illustrated in the example depicted in FIG. 3 is that a biasing node 346 disposed in semiconductor material 316 is shared among each one of the P enhanced SPAD photodiodes 314A, 314B, 314C and 314D in accordance with the teachings of the present invention. Thus, in the example depicted in FIG. 3, each one of the P enhanced SPAD photodiodes 314A, 314B, 314C and 314D is disposed in semiconductor 316 having the same bias voltage coupled to shared biasing node 346 in accordance with the teachings of the present invention.

Therefore, it is appreciated that example P enhanced SPAD photodiodes 314A, 314B, 314C and 314D of FIG. 3 (as well as example P enhanced SPAD photodiodes 214 of FIG. 2) do not utilize a guard ring or a doped well for isolation. As a result, the pixel cell sizes in photon sensor 302 can be greatly reduced. The reduced area required for each pixel cell of photon sensor 302 improves resolution and reduces costs. It is also appreciated that due to process differences between shallow trench isolation (STI) and DTI, the dark current of the example P enhanced SPAD photodiodes disclosed herein does not increase due to the biased DTI structures described herewith in accordance with the teachings of the present invention. The reduced dark current reduces noise and provides higher sensitivity to photons in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photon detection device, comprising:
a photodiode having a planar junction disposed in a first region of semiconductor material, wherein the semiconductor material includes P doped silicon and the planar junction includes an N doped silicon region disposed proximate to a P doped silicon region in the semiconductor material, wherein a doping density in the N doped silicon region gradually decreases towards an edge of the N doped silicon region, wherein the edge of the N doped silicon region does not utilize a guard ring or a doped well for isolation; and
a deep trench isolation (DTI) structure disposed in the semiconductor material, wherein the DTI structure isolates the first region of the semiconductor material on one side of the DTI structure from a second region of the semiconductor material on an other side of the DTI structure, wherein the DTI structure includes:
a dielectric layer lining an inside surface of the DTI structure; and
doped semiconductor material disposed over the dielectric layer inside the DTI structure, wherein the doped semiconductor material disposed inside the DTI structure is coupled to a bias voltage to isolate the photodiode in the first region of the semiconductor material from the second region of the semiconductor material.

2. The photon detection device of claim 1 wherein the planar junction is coupled to be reverse biased such that electrons drift from the P doped silicon in the semiconductor material into the planar junction.

3. The photon detection device of claim 1 wherein the photodiode having the planar junction disposed in the first region of the semiconductor material includes a single photon avalanche diode (SPAD), wherein the doped semiconductor material disposed in the DTI structure is biased to reduce dark current in a photo collection area the SPAD.

4. The photon detection device of claim 3 further comprising a quenching circuit disposed in the second region of the semiconductor material and coupled to the SPAD to limit an avalanche current in the SPAD, wherein the doped semiconductor material disposed in the DTI structure is biased to isolate high field regions of the SPAD from the quenching circuit.

5. The photon detection device of claim 4 wherein the first region of the semiconductor material is coupled to a first voltage to bias the first region of the semiconductor material at the first voltage, wherein the second region of the semiconductor material is coupled to a second voltage to bias the second region of the semiconductor material at the second voltage.

6. The photon detection device of claim 5 wherein the planar junction of the photodiode is coupled to a third voltage, wherein a reverse bias in the planar junction of the photodiode is responsive to the first voltage coupled to the first region and the third voltage coupled to the planar junction of the photo diode.

7. The photon detection device of claim 3 further comprising a second photodiode including a second SPAD disposed in the second region of the semiconductor material, wherein the doped semiconductor material disposed in the DTI structure is biased to isolate high field regions of the SPAD from high field regions of the second SPAD.

8. The photon detection device of claim 7 wherein the first and second regions of the semiconductor material are coupled to a first voltage to bias the first and second regions of the semiconductor material at the first voltage.

9. The photon detection device of claim 8 wherein the semiconductor material includes a shared biasing node coupled to the first and second regions of the semiconductor material, wherein the shared biasing node is coupled to the first voltage to bias the first and second regions of the semiconductor material at the first voltage.

10. The photon detection device of claim 3 wherein the SPAD is adapted to be illuminated from a back side of the semiconductor material.

11. The photon detection device of claim 1 wherein the dielectric layer lining the inside surface of the DTI structure includes silicon dioxide.

12. The photon detection device of claim 1 wherein the doped semiconductor material disposed over the dielectric layer inside the DTI structure includes lightly doped polysilicon.

13. A photon sensing system, comprising:
a pixel array having a plurality of pixel cells, wherein each one of the plurality of pixel cells includes:
a photodiode having a planar junction disposed in a first region of semiconductor material, wherein the semiconductor material includes P doped silicon and the planar junction includes an N doped silicon region disposed proximate to a P doped silicon region in the semiconductor material, wherein a doping density in the N doped silicon region gradually decreases towards an edge of the N doped silicon region, wherein the edge of the N doped silicon region does not utilize a guard ring or a doped well for isolation; and
a deep trench isolation (DTI) structure disposed in the semiconductor material, wherein the DTI structure isolates the first region of the semiconductor material on one side of the DTI structure from a second region of the semiconductor material on an other side of the DTI structure, wherein the DTI structure includes a dielectric layer lining an inside surface of the DTI structure and doped semiconductor material disposed over the dielectric layer inside the DTI structure, wherein the doped semiconductor material disposed inside the DTI structure is coupled to a bias voltage to isolate the photodiode in the first region of the semiconductor material from the second region of the semiconductor material;
control circuitry coupled to the pixel array to control operation of the pixel array; and
readout circuitry coupled to the pixel array to readout photon data from the plurality of pixel cells.

14. The photon sensing system of claim 13 further comprising function logic coupled to the readout circuitry to store the photon data readout from the plurality of pixel cells.

15. The photon sensing system of claim 14 wherein the dielectric layer lining the inside surface of the DTI structure includes silicon dioxide.

16. The photon sensing system of claim 14 wherein the doped semiconductor material disposed over the dielectric layer inside the DTI structure includes lightly doped polysilicon.

17. The photon sensing system of claim 13 wherein the readout circuitry includes:
counter circuitry coupled to receive the photon data to count photon events in the photon data received from each one of the plurality of pixel cells; and
time to digital converter circuitry coupled to the counter circuitry to record photon timing information associated with the photon events in the photon data.

18. The photon sensing system of claim 13 wherein the photodiode having the planar junction disposed in the first region of the semiconductor material includes a single photon avalanche diode (SPAD), wherein the doped semiconductor material disposed in the DTI structure is biased to reduce dark current in a photo collection area the SPAD.

19. The photon sensing system of claim 18 further comprising a quenching circuit disposed in the second region of the semiconductor material and coupled to the SPAD to limit an avalanche current in the SPAD, wherein the doped semiconductor material disposed in the DTI structure is biased to isolate high field regions of the SPAD from the quenching circuit.

20. The photon sensing system of claim 19 wherein the first region of the semiconductor material is coupled to a first voltage to bias the first region of the semiconductor material at the first voltage, wherein the second region of the semiconductor material is coupled to a second voltage to bias the second region of the semiconductor material at the second voltage.

21. The photon sensing system of claim 20 wherein the planar junction of the photodiode is coupled to a third voltage, wherein a reverse bias in the planar junction of the photodiode is responsive to the first voltage coupled to the first region and the third voltage coupled to the planar junction of the photodiode.

22. The photon sensing system of claim 18 further comprising a second photodiode including a second SPAD disposed in the second region of the semiconductor material, wherein the doped semiconductor material disposed in the DTI structure is biased to isolate high field regions of the SPAD from high field regions of the second SPAD.

23. The photon sensing system of claim 22 wherein the first and second regions of the semiconductor material are coupled to a first voltage to bias the first and second regions of the semiconductor material at the first voltage.

24. The photon sensing system of claim 23 wherein the semiconductor material includes a shared biasing node coupled to the first and second regions of the semiconductor material, wherein the shared biasing node is coupled to the first voltage to bias the first and second regions of the semiconductor material at the first voltage.

25. The photon sensing system of claim 18 wherein the SPAD is adapted to be illuminated from a back side of the semiconductor material.

* * * * *